(12) United States Patent
Koniaris et al.

(10) Patent No.: US 9,407,241 B2
(45) Date of Patent: *Aug. 2, 2016

(54) CLOSED LOOP FEEDBACK CONTROL OF INTEGRATED CIRCUITS

(76) Inventors: Kleanthes G. Koniaris, Palo Alto, CA (US); James B. Burr, Foster City, CA (US)

(*) Notice: Subject to any disclaimer, the term of this patent is extended or adjusted under 35 U.S.C. 154(b) by 813 days.

This patent is subject to a terminal disclaimer.

(21) Appl. No.: 13/587,827

(22) Filed: Aug. 16, 2012

(65) Prior Publication Data

US 2012/0319721 A1 Dec. 20, 2012

Related U.S. Application Data

(63) Continuation of application No. 12/651,244, filed on Dec. 31, 2009, now Pat. No. 8,253,434, which is a continuation of application No. 12/037,784, filed on Feb. 26, 2008, now Pat. No. 7,671,621, which is a continuation of application No. 11/490,356, filed on Jul. 19, 2006, now Pat. No. 7,336,092, which is a continuation of application No. 10/956,207, filed on Sep. 30, 2004, now Pat. No. 7,180,322.

(51) Int. Cl.
| | | |
|---|---|---|
| *G01R 31/02* | (2006.01) | |
| *G01R 31/26* | (2014.01) | |
| *H03K 3/012* | (2006.01) | |
| *G05B 13/02* | (2006.01) | |
| *G06F 1/32* | (2006.01) | |

(52) U.S. Cl.
CPC ............. *H03K 3/012* (2013.01); *G05B 13/021* (2013.01); *G06F 1/3203* (2013.01); *G06F 1/324* (2013.01); *G06F 1/3296* (2013.01); *Y02B 60/1217* (2013.01); *Y02B 60/1285* (2013.01)

(58) Field of Classification Search
CPC ..................................................... H03K 3/012
See application file for complete search history.

(56) References Cited

U.S. PATENT DOCUMENTS

| | | | |
|---|---|---|---|
| 4,246,517 A | 1/1981 | Dakroub | |
| 4,335,445 A | 6/1982 | Nercessian | |
| 4,679,130 A | 7/1987 | Moscovici | |
| 4,739,252 A | 4/1988 | Malaviya et al. | |
| 4,769,784 A | 9/1988 | Doluca et al. | |

(Continued)

FOREIGN PATENT DOCUMENTS

| | | |
|---|---|---|
| EP | 0381021 | 8/1990 |
| EP | 0474963 | 3/1992 |

(Continued)

OTHER PUBLICATIONS

Oner et al., "A compact Monitoring Circuit for Real-Time On-Chip Diagnosis of Hot-Carrier Induced Degradation" Microelectronic test structures. Proceedings, IEEE International Conference in Monterey, CA. Mar. 17, 1997-Mar. 20, 1997, pp. 72-76.

(Continued)

*Primary Examiner* — Jermele M Hollington

(57) ABSTRACT

Systems and methods for closed loop feedback control of integrated circuits. In one embodiment, a plurality of controllable inputs to an integrated circuit is adjusted to achieve a predetermined value of a dynamic operating indicator of the integrated circuit. An operating condition of an integrated circuit is controlled via closed loop feedback based on dynamic operating indicators of the integrated circuit's behavior.

20 Claims, 5 Drawing Sheets

(56) References Cited

U.S. PATENT DOCUMENTS

| | | |
|---|---|---|
| 4,794,278 A | 12/1988 | Vajdic |
| 4,798,974 A | 1/1989 | Reczek et al. |
| 4,893,228 A | 1/1990 | Orrick et al. |
| 4,912,347 A | 3/1990 | Morris |
| 4,929,621 A | 5/1990 | Manoury et al. |
| 5,039,877 A | 8/1991 | Chern |
| 5,086,501 A | 2/1992 | DeLuca et al. |
| 5,103,110 A | 4/1992 | Housworth et al. |
| 5,113,088 A | 5/1992 | Yamamoto et al. |
| 5,124,632 A | 6/1992 | Greaves |
| 5,167,024 A | 11/1992 | Smith et al. |
| 5,201,059 A | 4/1993 | Nguyen |
| 5,204,863 A | 4/1993 | Saint-Joigny et al. |
| 5,218,704 A | 6/1993 | Watts, Jr. et al. |
| 5,230,055 A | 7/1993 | Katz et al. |
| 5,239,652 A | 8/1993 | Seibert et al. |
| 5,254,883 A | 10/1993 | Horowitz et al. |
| 5,336,986 A | 8/1994 | Allman |
| 5,386,135 A | 1/1995 | Nakazato et al. |
| 5,394,026 A | 2/1995 | Yu et al. |
| 5,406,212 A | 4/1995 | Hashinaga et al. |
| 5,410,278 A | 4/1995 | Itoh et al. |
| 5,422,591 A | 6/1995 | Rastegar et al. |
| 5,422,806 A | 6/1995 | Chen et al. |
| 5,440,520 A | 8/1995 | Schutz et al. |
| 5,447,876 A | 9/1995 | Moyer et al. |
| 5,461,266 A | 10/1995 | Koreeda et al. |
| 5,483,434 A | 1/1996 | Seesink |
| 5,495,184 A | 2/1996 | Des Rosiers et al. |
| 5,502,838 A | 3/1996 | Kikinis |
| 5,506,541 A | 4/1996 | Herndon |
| 5,511,203 A | 4/1996 | Wisor et al. |
| 5,513,152 A | 4/1996 | Cabaniss |
| 5,519,309 A | 5/1996 | Smith |
| 5,560,020 A | 9/1996 | Nakatani et al. |
| 5,568,103 A | 10/1996 | Nakashima et al. |
| 5,592,173 A | 1/1997 | Lau et al. |
| 5,594,360 A | 1/1997 | Wojciechowski |
| 5,680,359 A | 10/1997 | Jeong |
| 5,682,093 A | 10/1997 | Kivela |
| 5,692,204 A | 11/1997 | Rawson et al. |
| 5,717,319 A | 2/1998 | Jokinen |
| 5,719,800 A | 2/1998 | Mittal et al. |
| 5,727,208 A | 3/1998 | Brown |
| 5,744,996 A | 4/1998 | Kotzle et al. |
| 5,745,375 A | 4/1998 | Reinhardt et al. |
| 5,752,011 A | 5/1998 | Thomas et al. |
| 5,754,869 A | 5/1998 | Holzhammer et al. |
| 5,757,171 A | 5/1998 | Babcock |
| 5,764,110 A | 6/1998 | Ishibashi |
| 5,778,237 A | 7/1998 | Yamamoto et al. |
| 5,781,060 A | 7/1998 | Sugawara |
| 5,812,860 A | 9/1998 | Horden et al. |
| 5,815,724 A | 9/1998 | Mates |
| 5,815,725 A | 9/1998 | Feierbach |
| 5,818,290 A | 10/1998 | Tsukada |
| 5,825,674 A | 10/1998 | Jackson |
| 5,838,189 A | 11/1998 | Jeon |
| 5,842,860 A | 12/1998 | Funt |
| 5,848,281 A | 12/1998 | Smalley et al. |
| 5,884,049 A | 3/1999 | Atkinson |
| 5,894,577 A | 4/1999 | MacDonald et al. |
| 5,900,773 A | 5/1999 | Susak |
| 5,920,226 A | 7/1999 | Mimura |
| 5,923,545 A | 7/1999 | Nguyen |
| 5,929,621 A | 7/1999 | Angelici et al. |
| 5,933,649 A | 8/1999 | Lim et al. |
| 5,940,020 A | 8/1999 | Ho |
| 5,940,785 A | 8/1999 | Georgiou et al. |
| 5,940,786 A | 8/1999 | Steeby |
| 5,952,871 A | 9/1999 | Jeon |
| 5,974,557 A | 10/1999 | Thomas et al. |
| 5,977,763 A | 11/1999 | Loughmiller et al. |
| 5,986,947 A | 11/1999 | Choi et al. |
| 5,996,083 A | 11/1999 | Gupta et al. |
| 5,996,084 A | 11/1999 | Watts |
| 5,999,040 A | 12/1999 | Do et al. |
| 6,006,169 A | 12/1999 | Sandhu et al. |
| 6,011,403 A | 1/2000 | Gillette |
| 6,018,264 A | 1/2000 | Jin |
| 6,021,500 A | 2/2000 | Wang et al. |
| 6,035,407 A | 3/2000 | Gebara et al. |
| 6,047,248 A | 4/2000 | Georgiou et al. |
| 6,048,746 A | 4/2000 | Burr |
| 6,052,022 A | 4/2000 | Lee |
| 6,078,084 A | 6/2000 | Nakamura et al. |
| 6,078,319 A | 6/2000 | Bril et al. |
| 6,087,820 A | 7/2000 | Houghton et al. |
| 6,087,892 A | 7/2000 | Burr |
| 6,091,283 A | 7/2000 | Murgula et al. |
| 6,100,751 A | 8/2000 | De et al. |
| 6,118,306 A | 9/2000 | Orton et al. |
| 6,119,241 A | 9/2000 | Michail et al. |
| 6,141,762 A | 10/2000 | Nicol et al. |
| 6,157,092 A | 12/2000 | Hofmann |
| 6,172,943 B1 | 1/2001 | Yuzuki |
| 6,202,104 B1 | 3/2001 | Ober |
| 6,215,235 B1 | 4/2001 | Osamura |
| 6,216,235 B1 | 4/2001 | Thomas et al. |
| 6,218,708 B1 | 4/2001 | Burr |
| 6,226,335 B1 | 5/2001 | Prozorov |
| 6,229,379 B1 | 5/2001 | Okamoto |
| 6,229,747 B1 | 5/2001 | Cho et al. |
| 6,232,830 B1 | 5/2001 | Fournel |
| 6,242,936 B1 | 6/2001 | Ho et al. |
| 6,272,642 B2 | 8/2001 | Pole, II et al. |
| 6,279,048 B1 | 8/2001 | Fadavi-Ardekani et al. |
| 6,281,716 B1 | 8/2001 | Mihara |
| 6,303,444 B1 | 10/2001 | Burr |
| 6,304,824 B1 | 10/2001 | Bausch et al. |
| 6,305,407 B1 | 10/2001 | Selby |
| 6,311,287 B1 | 10/2001 | Dischler et al. |
| 6,314,522 B1 | 11/2001 | Chu et al. |
| 6,320,453 B1 | 11/2001 | Manning |
| 6,337,593 B1 | 1/2002 | Mizuno et al. |
| 6,345,362 B1 | 2/2002 | Bertin et al. |
| 6,345,363 B1 | 2/2002 | Levy-Kendler |
| 6,347,379 B1 | 2/2002 | Dai et al. |
| 6,370,046 B1 | 4/2002 | Nebrigic et al. |
| 6,373,323 B2 | 4/2002 | Kuroda |
| 6,373,325 B1 | 4/2002 | Kuriyama |
| 6,378,081 B1 | 4/2002 | Hammond |
| 6,388,432 B2 | 5/2002 | Uchida |
| 6,407,571 B1 | 6/2002 | Furuya et al. |
| 6,415,388 B1 | 7/2002 | Browning et al. |
| 6,422,746 B1 | 7/2002 | Weiss et al. |
| 6,424,203 B1 | 7/2002 | Bayadroun |
| 6,424,217 B1 | 7/2002 | Kwong |
| 6,425,086 B1 | 7/2002 | Clark et al. |
| 6,426,641 B1 | 7/2002 | Koch et al. |
| 6,427,211 B2 | 7/2002 | Watts, Jr. |
| 6,442,746 B1 | 8/2002 | James et al. |
| 6,447,246 B1 | 9/2002 | Abe et al. |
| 6,457,134 B1 | 9/2002 | Lemke et al. |
| 6,457,135 B1 | 9/2002 | Cooper |
| 6,466,077 B1 | 10/2002 | Miyazaki et al. |
| 6,469,573 B2 | 10/2002 | Kanda et al. |
| 6,476,632 B1 | 11/2002 | La Rosa et al. |
| 6,477,654 B1 | 11/2002 | Dean et al. |
| 6,486,729 B2 | 11/2002 | Imamiya |
| 6,487,668 B2 | 11/2002 | Thomas et al. |
| 6,489,224 B1 | 12/2002 | Burr |
| 6,489,796 B2 | 12/2002 | Tomishima |
| 6,496,027 B1 | 12/2002 | Sher et al. |
| 6,496,057 B2 | 12/2002 | Wada et al. |
| 6,510,400 B1 | 1/2003 | Moriyama |
| 6,510,525 B1 | 1/2003 | Nookala et al. |
| 6,513,124 B1 | 1/2003 | Furuichi et al. |
| 6,515,903 B1 | 2/2003 | Le et al. |
| 6,518,828 B2 | 2/2003 | Seo et al. |
| 6,519,706 B1 | 2/2003 | Ogoro |
| 6,529,421 B1 | 3/2003 | Marr et al. |
| 6,531,912 B2 | 3/2003 | Katou |
| 6,563,371 B2 | 5/2003 | Buckley, III et al. |

(56) References Cited

U.S. PATENT DOCUMENTS

| | | |
|---|---|---|
| 6,570,371 B1 | 5/2003 | Volk |
| 6,574,577 B2 | 6/2003 | Stapleton et al. |
| 6,574,739 B1 | 6/2003 | Kung et al. |
| 6,600,346 B1 | 7/2003 | Macaluso |
| 6,617,656 B2 | 9/2003 | Lee et al. |
| 6,642,774 B1 | 11/2003 | Li |
| 6,657,504 B1 | 12/2003 | Deal et al. |
| 6,675,360 B1 | 1/2004 | Cantone et al. |
| 6,677,643 B2 | 1/2004 | Iwamoto et al. |
| 6,700,434 B2 | 3/2004 | Fujii et al. |
| 6,731,221 B1 | 5/2004 | Dioshongh et al. |
| 6,737,909 B2 | 5/2004 | Jaussi et al. |
| 6,741,118 B2 | 5/2004 | Uchikoba et al. |
| 6,774,705 B2 | 8/2004 | Miyazaki et al. |
| 6,784,722 B2 | 8/2004 | Tang et al. |
| 6,791,146 B2 | 9/2004 | Lai et al. |
| 6,791,212 B2 | 9/2004 | Pulvirenti et al. |
| 6,792,379 B2 | 9/2004 | Ando |
| 6,803,633 B2 | 10/2004 | Mergens et al. |
| 6,809,968 B2 | 10/2004 | Marr et al. |
| 6,815,971 B2 | 11/2004 | Wang et al. |
| 6,865,116 B2 | 3/2005 | Kim et al. |
| 6,882,172 B1 | 4/2005 | Suzuki et al. |
| 6,885,210 B1 | 4/2005 | Suzuki |
| 6,889,331 B2 | 5/2005 | Soerensen et al. |
| 6,906,582 B2 | 6/2005 | Kase et al. |
| 6,917,240 B2 | 7/2005 | Trafton et al. |
| 6,922,783 B2 | 7/2005 | Knee et al. |
| 6,927,620 B2 | 8/2005 | Senda |
| 6,936,898 B2 | 8/2005 | Pelham et al. |
| 6,967,522 B2 | 11/2005 | Chandrakasan et al. |
| 6,986,068 B2 | 1/2006 | Togawa |
| 6,992,508 B2 | 1/2006 | Chow |
| 7,012,461 B1 | 3/2006 | Chen et al. |
| 7,030,681 B2 | 4/2006 | Yamazaki et al. |
| 7,100,061 B2 | 8/2006 | Halepete et al. |
| 7,112,978 B1 | 9/2006 | Koniaris et al. |
| 7,119,604 B2 | 10/2006 | Chih |
| 7,120,804 B2 | 10/2006 | Tschanz et al. |
| 7,129,745 B2 | 10/2006 | Lewis et al. |
| 7,180,322 B1 | 2/2007 | Koniaris et al. |
| 7,228,242 B2 | 6/2007 | Read et al. |
| 7,334,198 B2 | 2/2008 | Ditzel et al. |
| 7,336,090 B1 | 2/2008 | Koniaris et al. |
| 7,336,092 B1 | 2/2008 | Koniaris et al. |
| 7,348,827 B2 | 3/2008 | Rahim et al. |
| 7,362,165 B1 | 4/2008 | Chen |
| 7,363,176 B2 | 4/2008 | Patel et al. |
| 7,439,730 B2 | 10/2008 | Desplats et al. |
| 7,562,233 B1 | 7/2009 | Sheng et al. |
| 7,626,409 B1 | 12/2009 | Koniaris et al. |
| 7,671,621 B2 | 3/2010 | Koniaris et al. |
| 8,040,149 B2 | 10/2011 | Koniaris et al. |
| 2001/0028577 A1 | 10/2001 | Sung et al. |
| 2002/0002689 A1 | 1/2002 | Yeh |
| 2002/0011650 A1 | 1/2002 | Nishizawa et al. |
| 2002/0026597 A1 | 2/2002 | Dai et al. |
| 2002/0029352 A1 | 3/2002 | Borkar et al. |
| 2002/0032829 A1 | 3/2002 | Dalrymple |
| 2002/0067638 A1 | 6/2002 | Kobayashi et al. |
| 2002/0073348 A1 | 6/2002 | Tani |
| 2002/0083356 A1 | 6/2002 | Dai |
| 2002/0087219 A1 | 7/2002 | Dai |
| 2002/0087896 A1 | 7/2002 | Cline et al. |
| 2002/0116650 A1 | 8/2002 | Halepete et al. |
| 2002/0130701 A1 | 9/2002 | Kleveland |
| 2002/0138778 A1 | 9/2002 | Cole et al. |
| 2002/0140494 A1 | 10/2002 | Thomas et al. |
| 2002/0178390 A1 | 11/2002 | Lee |
| 2002/0194509 A1 | 12/2002 | Plante et al. |
| 2003/0006590 A1 | 1/2003 | Aoki et al. |
| 2003/0036876 A1 | 2/2003 | Fuller, III et al. |
| 2003/0065960 A1 | 4/2003 | Rusu et al. |
| 2003/0071657 A1 | 4/2003 | Soerensen et al. |
| 2003/0074591 A1 | 4/2003 | McClendon et al. |
| 2003/0098736 A1 | 5/2003 | Uckikoba et al. |
| 2003/0189465 A1 | 10/2003 | Abadeer et al. |
| 2004/0025061 A1 | 2/2004 | Lawrence |
| 2004/0073821 A1 | 4/2004 | Naveh et al. |
| 2004/0103330 A1 | 5/2004 | Bonnett |
| 2004/0108881 A1 | 6/2004 | Bokui et al. |
| 2004/0123170 A1 | 6/2004 | Tschanz et al. |
| 2004/0128631 A1 | 7/2004 | Ditzel et al. |
| 2004/0246044 A1 | 12/2004 | Myono et al. |
| 2005/0225376 A1 | 10/2005 | Kin Law |
| 2006/0074576 A1 | 4/2006 | Patel et al. |
| 2007/0229054 A1 | 10/2007 | Dobberpuhl et al. |
| 2007/0283176 A1 | 12/2007 | Tobias et al. |
| 2007/0296440 A1 | 12/2007 | Takamiya et al. |
| 2008/0143372 A1 | 6/2008 | Koniaris et al. |
| 2010/0060306 A1 | 3/2010 | Koniaris et al. |
| 2012/0001651 A1 | 1/2012 | Koniaris et al. |

FOREIGN PATENT DOCUMENTS

| | | |
|---|---|---|
| EP | 0501655 | 9/1992 |
| EP | 0978781 | 2/2000 |
| EP | 1398639 | 3/2004 |
| JP | 09-185589 | 7/1997 |
| WO | 01/27728 | 4/2001 |

OTHER PUBLICATIONS

Computer Software, Wikipedia; "http://en.wikipedia.org/wiki/Software"; retrieved on May 2, 2007.

"High-Speed, Digitally Adjusted Stepdown Controllers for Notebook CPUS", Maxim Manual, Jul. 2000, pp. 1-28.

Desai, et al.; "Sizing of Clock Distribution Networks for High Performance CPU Chips"; Digital Equipment Corporation, Hudson, MA, Jun. 1996, pp. 389-394.

Baker, K., et al,; "SHMOO Plotting: The Black Art of IC Testing"; IEEE Design & Test of Computers, IEEE vol. 14, No. 3; July 1, 1997, pp. 90-97, XP000793305 ISSN: 0740-7475 (the whole document).

"Wafer Burn-In Isolation Circuit"; IBM Technical Disclosure Bulletin; IBM Corp, New York, US, vol. 32, No. 6B, Nov. 1, 1989, pp. 442-443; XP00073858 ISSN: 0018-8689 (the Whole Document).

"LTC 1736 Product", Linear Technology Manual, Jan. 1999, pp. 1-28.

CLOSED LOOP FEEDBACK CONTROL OF INTEGRATED CIRCUITS

RELATED APPLICATIONS

This is a Continuation application of, and claims benefit to, U.S. patent application Ser. No. 12/651,244, now U.S. Pat. No. 8,253,434, filed Dec. 31, 2009, to Koniaris and Burr, which in turn was a Continuation application of, and claimed benefit to, U.S. Pat. No. 7,671,621, filed Feb. 26, 2008, to Koniaris and Burr, which in turn was a Continuation application of, and claimed benefit to, U.S. Pat. No. 7,336,092, filed Jul. 19, 2006, to Koniaris and Burr, which in turn was a continuation patent application of, and claimed benefit to, U.S. Pat. No. 7,180,322, filed on Sep. 30, 2005. All such applications are hereby incorporated herein by reference in their entireties.

U.S. Pat. No. 7,180,322 was a continuation in part of, and claimed benefit to, U.S. Pat. No. 6,882,172, entitled "System and Method for Measuring Transistor Leakage Current with a Ring Oscillator" to Suzuki and Burr, which is hereby incorporated herein by reference in its entirety.

U.S. Pat. No. 7,180,322 was a continuation in part of, and claimed benefit to, U.S. Pat. No. 6,885,210, entitled "A System and Method for Measuring Transistor Leakage Current with a Ring Oscillator with Backbias Controls" to Suzuki, which is hereby incorporated herein by reference in its entirety.

U.S. Pat. No. 7,180,322 was a continuation in part of, and claimed benefit to, U.S. Pat. No. 7,941,675, entitled "Adaptive Power Control" to Burr et al., which is hereby incorporated herein by reference in its entirety.

FIELD OF THE INVENTION

Embodiments in accordance with the present invention relate to systems and methods for closed loop feedback control of integrated circuits.

BACKGROUND

In order to operate an integrated circuit, e.g., a microprocessor, in an efficient manner, for example, to consume a low amount of energy to accomplish a task, it is known to adjust various controlling parameters. These parameters may include an operating voltage that can be adjusted to a value characteristic of an advantageous power condition in accordance with the task to be accomplished. For example, an operating voltage is set to a minimized value consistent with a desired frequency of operation. In the conventional art, such operating points are applied in an open loop manner.

SUMMARY OF THE INVENTION

Therefore, systems and methods for closed loop feedback control of integrated circuits are highly desired.

Accordingly, systems and methods for closed loop feedback control of integrated circuits are disclosed. In one embodiment, a plurality of controllable inputs to an integrated circuit is adjusted to achieve a predetermined value of a dynamic operating indicator of the integrated circuit. An operating condition of an integrated circuit is controlled via closed loop feedback based on dynamic operating indicators of the measured behavior of the integrated circuit.

In accordance with other embodiments of the present invention, a plurality of controllable input values to an integrated circuit is determined that achieves a desirably low power operating condition of the integrated circuit for a given operating frequency.

In accordance with yet other embodiments of the present invention, a dynamic operating condition of an integrated circuit is measured for a specific operating frequency at controllable input values that achieve an advantageous low power operating condition of the integrated circuit.

In one exemplary embodiment of the present invention, the integrated circuit is a microprocessor capable of operating at various frequencies and voltages.

DETAILED DESCRIPTION OF THE INVENTION

Figure 1:
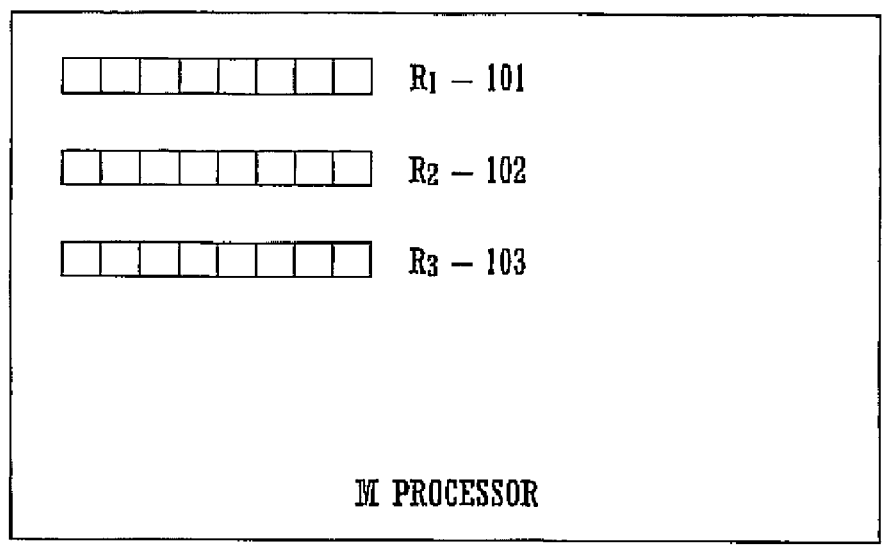
FIG. 1 illustrates a microprocessor comprising dynamic condition reporting registers, in accordance with embodiments of the present invention.

In the following detailed description of the present invention, system and method for closed loop feedback control of integrated circuits, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions that follow (e.g., process 200) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "storing" or "dividing" or "computing" or "testing" or "calculating" or "determining" or "storing" or "measuring"

or "adjusting" or "generating" or "performing" or "comparing" or "synchronizing" or "accessing" or "retrieving" or "conveying" or "sending" or "resuming" or "installing" or "gathering" or the like, refer to the action and processes of a computer system, processor, or similar electronic computing device that manipulates and transforms data represented as physical (electronic) quantities within the computer system's registers and memories into other data similarly represented as physical quantities within the computer system memories or registers or other such information storage, transmission or display devices.

Closed Loop Feedback Control of Integrated Circuits

Embodiments in accordance with the present invention are described in the context of design and operation of integrated semiconductors. More particularly, embodiments of the present invention relate to systems and methods for closed loop feedback control of integrated circuits. It is appreciated, however, that elements of the present invention may be utilized in other areas of semiconductor operation.

Several operational indicators of an integrated circuit, e.g., a microprocessor, can be measured dynamically, e.g., in-situ while the integrated circuit is in operation. For example, the operating temperature of the integrated circuit can be measured. Such measurements can be external, e.g., via an applied thermocouple, or they can be made internally, e.g., via on-chip measurement circuits.

A wide variety of integrated circuit characteristics can be measured or determined, either directly or inferred from other characteristics, while the device is operating. For example, in addition to temperature, other characteristics such as gate delays, metal delays, leakage current, "on" or active current, relative behavior of NMOS and PMOS devices, maximum frequency and the like can be measured or determined for the instant operating conditions of an integrated circuit. Co-pending, commonly owned U.S. patent application Ser. No. 10/124,152, filed Apr. 16, 2002, entitled "System and Method for Measuring Transistor Leakage Current with a Ring Oscillator" and incorporated by reference herein, provides exemplary systems and methods of such dynamic determinations, or dynamic operating indicators, that are well suited to embodiments in accordance with the present invention.

Such measurements or indications are typically made available, e.g., to state machines and/or processor control software, via registers. Such register values frequently comprise a count of a number of events, e.g., oscillations of a ring oscillator in a given time interval. It is appreciated that there are many methods of creating such indications, and all such indications are well suited to embodiments in accordance with the present invention. For the purpose of illustrating embodiments in accordance with the present invention, a model of a register reporting a value that is correlated to an operating characteristic of an integrated circuit is employed. It is to be appreciated, however, that embodiments in accordance with the present invention are well suited to a variety of systems and methods of determining and reporting dynamic operating conditions of an integrated circuit.

FIG. 1 illustrates a microprocessor 100 comprising dynamic condition reporting registers, in accordance with embodiments of the present invention. Dynamic condition reporting registers R1 101, R2 102 and R3 103 each indicate a dynamic condition metric of microprocessor 100. For example, generally each dynamic condition reporting register is associated with a dynamic condition measuring circuit either as a part of the integrated circuit or external to the integrated circuit. Conversion of a measured quantity, e.g., oscillations of a particular ring oscillator, into a usable metric related to the measured quantity, e.g., a frequency measurement, e.g., in hertz, or a count of oscillations per unit time, can be embodied in either software or hardware, and all such embodiments are to be considered within the scope of the present invention. For example, logic circuitry can increment a counting register for each oscillation for a period of time. If the count exceeds a predetermined limit, an interrupt can be created to enable software adjustment of a feedback loop. Alternatively, for example, a software timing loop, with or without hardware timing assistance, can count a number of oscillations per unit time. In accordance with embodiments of the present invention, dynamic condition reporting registers, e.g., dynamic condition reporting registers R1 101, R2 102 and R3 103, can refer to any memory location utilized to store such indications of a dynamic condition.

As operating conditions of microprocessor 100 change, values reported by dynamic condition reporting registers R1 101, R2 102 and R3 103 will generally change. For example, operating voltage and operating temperature are strong influences on a maximum operating frequency achievable by an integrated circuit. As operating voltage and/or operating temperature vary, so too in general will the values reported by dynamic condition reporting registers R1 101, R2 102 and R3 103.

For example, dynamic condition reporting register R1 101 can indicate a number of oscillations per time of a ring oscillator comprising complementary metal oxide inverter gates. Such a circuit can be utilized to indicate gate delays for the microprocessor at the instant operating conditions, e.g., operating temperature, operating voltage and the like. Similarly, other dynamic condition reporting registers can indicate other operational characteristics of microprocessor 100. For example, device leakage, gate leakage, temperature, metal delays, "on" current, behavior of n type and p type devices and/or relative behavior of n type and p type devices can be reported by dynamic condition reporting registers.

Most useful dynamic conditions indications will have a correlation with maximum achievable operating frequency of an integrated circuit at those operating conditions. For example, an indication of operating temperature will generally have a negative correlation with maximum achievable operating frequency (for operating voltages above about 0.6 volts). For example, as operating temperature increases, maximum achievable operating frequency generally decreases. Other dynamic condition indications may have a positive correlation with maximum achievable operating frequency. For example, the number of oscillations of a NAND-gate ring oscillator per unit time will generally increase as maximum achievable operating frequency of an integrated circuit increases.

Such correlations among dynamic conditions and maximum achievable operating frequency can be utilized in a system of closed loop feedback involving the condition registers, to optimize power consumption for operating an integrated circuit at a particular frequency.

Figure 2:
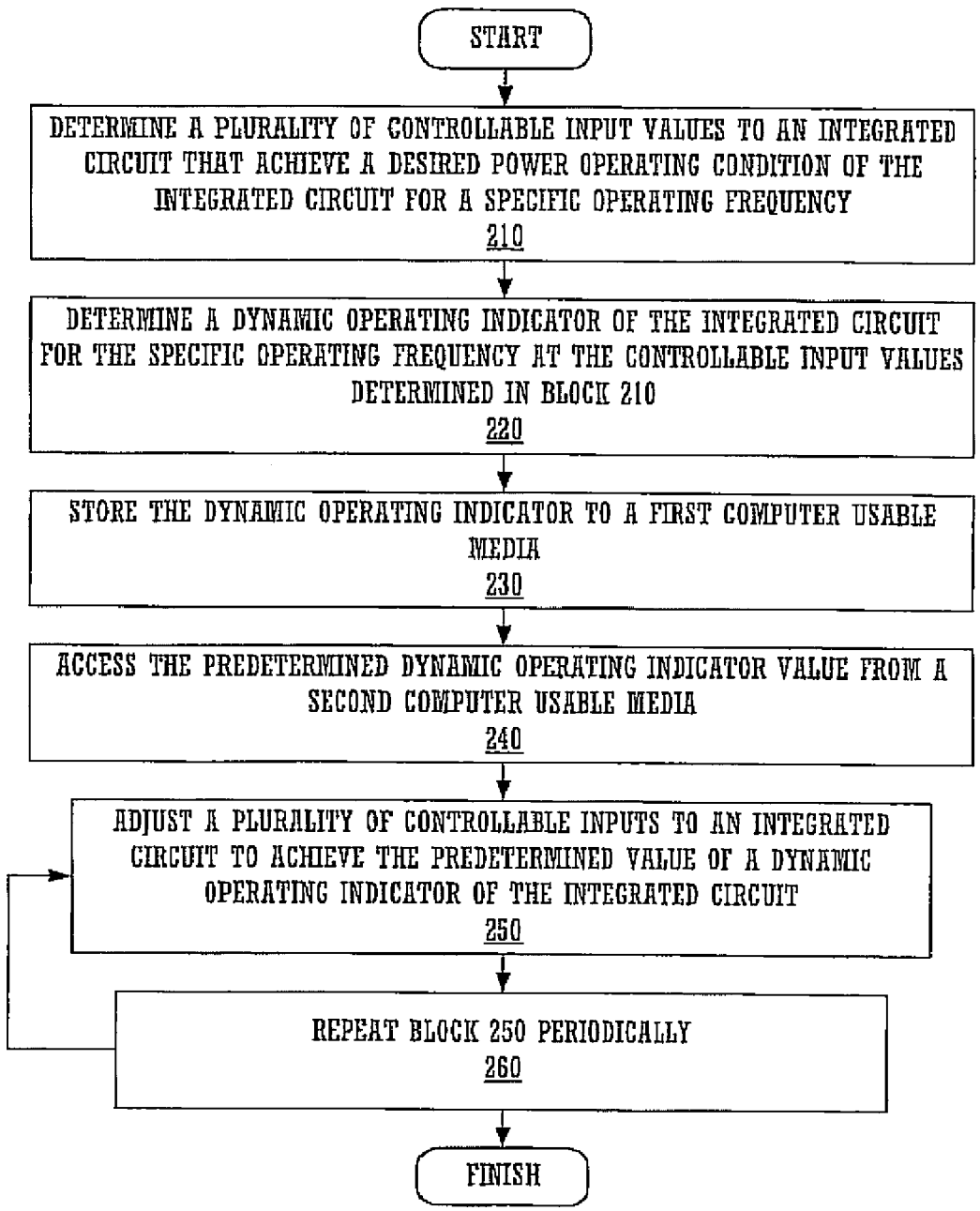
FIG. 2 illustrates a method of operating an integrated circuit, in accordance with embodiments of the present invention.

FIG. 2 illustrates a process 200 of operating an integrated circuit, in accordance with embodiments of the present invention. In optional block 210, a plurality of controllable input values to an integrated circuit is determined that achieves a desired power operating condition of the integrated circuit for a given operating frequency. In accordance with one embodiment of the present invention, the condition is a desired low power operating condition. Exemplary controllable inputs to an integrated circuit can include, for example, operating voltage(s), body biasing voltage(s) applied to NMOS devices and/or body biasing voltage(s) applied to PMOS devices.

For example, an integrated circuit tester can run test vectors against an integrated circuit at a particular operating frequency for a fixed operating temperature. Controllable inputs to the integrated circuit, e.g., operating voltage(s) and/or body biasing voltage(s), can be adjusted to decrease power consumption of the integrated circuit consistent with proper operation at the particular operating frequency. Power consumption of the integrated circuit should be minimized consistent with proper operation at the particular operating frequency. Block 200 can be repeated for a plurality of different operating frequencies and/or temperatures.

In optional block 220, a dynamic operating indicator of the integrated circuit is observed for the specific operating frequency at the controllable input values determined in block 210. For example, a dynamic condition reporting register value corresponding to a ring oscillator can be read, either by an integrated circuit tester or under software control. It is to be appreciated that such dynamic operating conditions are generally determined in digital form, e.g., as a count of events. However, embodiments in accordance with the present invention are well suited to the use of analog condition reporting, e.g., a condition expressed as a voltage or charge stored on a floating gate.

In optional block 230, the dynamic operating indicator value is stored to a first computer usable media. Such a dynamic operating condition value is well suited to a wide variety of storing methods and media. For example, such a value can be stored in non-volatile memory of the integrated circuit, in non-volatile memory of an integrated circuit package, or on media separate from the integrated circuit, e.g., on a separate non-volatile memory integrated circuit or in a computer system database. In accordance with an embodiment of the present invention, the indicator may be stored in a register of a microprocessor.

In optional block 240, the predetermined dynamic operating indicator value is accessed from a second computer usable media. It is to be appreciated that the first and second computer usable media can be the same media. Alternatively, the first and second computer usable media can be separate media. Embodiments in accordance with the present invention are well suited to utilizing a wide variety of media and techniques known to the data processing arts to transfer information of the dynamic operating condition between the first and second computer usable media.

It is to be appreciated that the predetermined dynamic operating indicator value is generally frequency specific. Consequently, if it is desirable to operate the integrated circuit at a different operating frequency, block 240 may be repeated to obtain a predetermined dynamic operating indicator value corresponding to the different operating frequency.

In block 250, a plurality of controllable inputs to an integrated circuit is adjusted to achieve the predetermined value of a dynamic operating indicator of the integrated circuit. It is to be appreciated that, in general, each controllable input can be adjusted independently of other such controllable inputs. In some cases, a range of controllable input values, e.g., a body bias voltage, can be influenced by another controllable input value, e.g., operating voltage. In optional block 260, block 250 is periodically repeated.

In accordance with embodiments of the present invention, the predetermined dynamic operating condition can be determined for a specific integrated circuit or for a group of integrated circuits, e.g., those from a common wafer, a production run or by part number.

In accordance with other embodiments of the present invention, the predetermined dynamic operating condition may comprise evaluation of a function and/or lists of values. Such a function may present a condition that the system attempts to have dynamic operating indicators meet. For example, it may be desirable to control a combination of dynamic operating condition values. Referring once again to FIG. 1, the predetermined dynamic operating condition could be determined as three times the value of register R1 101 squared plus 17 times the value of register R2 102 plus the value of register R3 103. Other functions and/or operations, e.g., boundary operations such as MIN and MAX, can further be applied to dynamic operating condition values. All such manipulations of dynamic operating condition values to form a predetermined dynamic operating condition are well suited to embodiments in accordance with the present invention.

In this novel manner, an operating condition of an integrated circuit, e.g., power consumption of a microprocessor, can be advantageously controlled via closed loop feedback based on dynamic operating indicators of the integrated circuit's behavior. Under the conventional art, controllable inputs to an integrated circuit, e.g., operating voltage, were based on open loop methods that provided, for example, a recommended operating voltage for a given operating frequency and/or temperature.

Figure 3A:
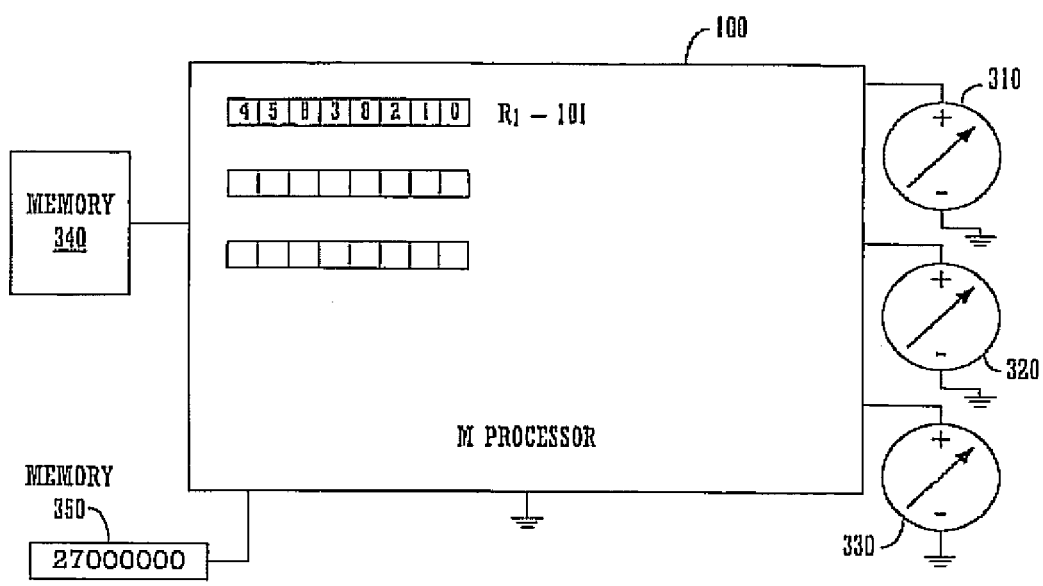
FIGS. 3A and 3B illustrate an exemplary application of portions of a method of operating an integrated circuit, in accordance with embodiments of the present invention.
Figure 3B:
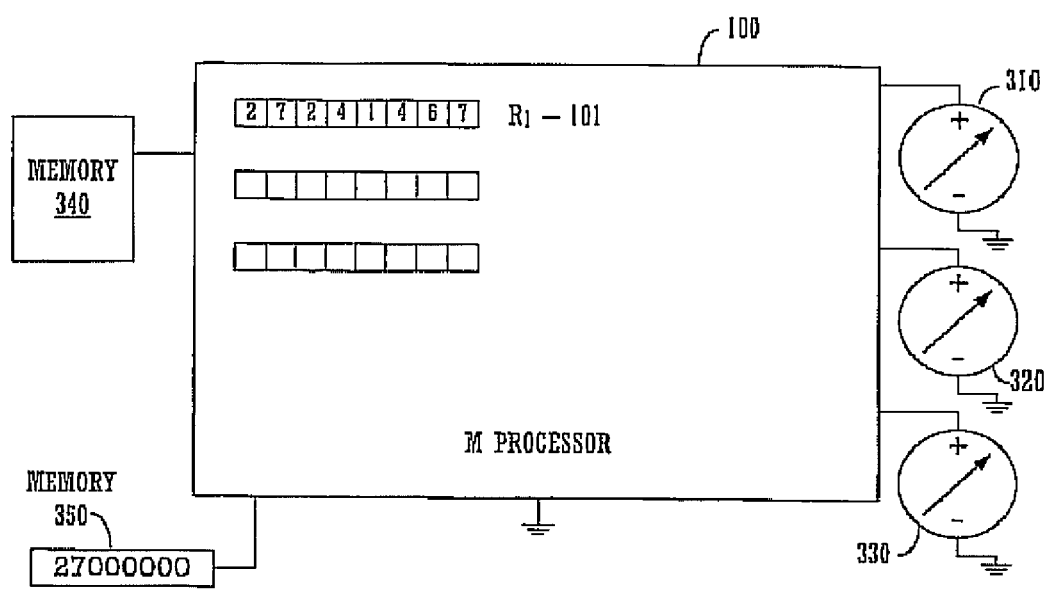

FIGS. 3A and 3B illustrate an exemplary application of portions of process 200, in accordance with embodiments of the present invention. Computer system 300 comprises microprocessor 100. Microprocessor 100 comprises dynamic condition reporting register R1 101. Dynamic condition reporting register R1 101 indicates a dynamic condition metric of microprocessor 100, e.g., a number of oscillations of a ring oscillator for a given time period. The time period may be externally measured, for example via a stable oscillator, e.g., a quartz oscillator. As operating conditions of microprocessor 100 change, values reported by dynamic condition reporting register R1 101 will generally change. For the purposes of the present example, assume that the value reported by dynamic condition reporting register R1 101 is positively correlated with maximum achievable operating frequency of microprocessor 100. For example, the greater the value in dynamic condition reporting register R1 101, the faster that microprocessor 100 can run. It is appreciated that embodiments in accordance with the present invention are well suited to negative correlations between dynamic condition reporting register values and maximum achievable operating frequency of a microprocessor.

Computer system 300 further comprises a first variable voltage supply 310 to provide an operating voltage to microprocessor 100. Optionally, computer system 300 can comprise a second variable voltage supply 320 to provide a body biasing voltage to n type devices, e.g., NMOS devices, of microprocessor 100. Similarly, computer system 300 can optionally comprise a third variable voltage supply 330 to provide a body biasing voltage to p type devices, e.g., PMOS devices, of microprocessor 100.

Computer system 300 also comprises a memory 340 coupled to microprocessor 100 that can be used to store data and programs for execution on microprocessor 100. Further, computer system 300 comprises a memory 350 for storing a predetermined value for a dynamic condition indicator. Memory 350 is well suited to being a part of memory 340, e.g., a location within memory 350.

The predetermined value for a dynamic condition indicator stored in memory 350, "27000000," represents a value of dynamic condition reporting register R1 101 that was previously determined. For example, this value can represent the value of dynamic condition reporting register R1 101 that corresponds to the lowest power operation of microprocessor 100 at a particular operating frequency, e.g., 500 MHz.

Referring now to FIG. 3A, at a point in time when microprocessor 100 is operating at 500 MHz, dynamic condition reporting register R1 101 reports a value of "45838210." Controllable inputs to microprocessor 100, e.g., operating voltage provided by first variable voltage supply 310 and body biasing voltages provided by second and third variable voltage supplies 320 and 330, are adjusted to achieve the predetermined value for dynamic condition reporting register R1 101, e.g., "27000000." For example, first variable voltage supply 310 can be commanded to reduce the operating voltage provided to microprocessor 100. It is to be appreciated that any or all controllable inputs can be adjusted in any combination and/or sequence in order to achieve the predetermined value for dynamic condition reporting register R1 101, in accordance with embodiments of the present invention.

Referring now to FIG. 3B, after such adjustments of controllable inputs to microprocessor 100, dynamic condition reporting register R1 101 reports a value of "27241467" that is very close to the predetermined value for dynamic condition reporting register R1 101, "27000000." It is to be appreciated that the actual predetermined value for dynamic condition reporting register R1 101 may not be achievable for a variety of reasons, including, for example, an operating temperature difference for microprocessor 100 between the point when the predetermined value for dynamic condition reporting register R1 101 was determined and the point in time represented by FIG. 3B.

Figure 4:
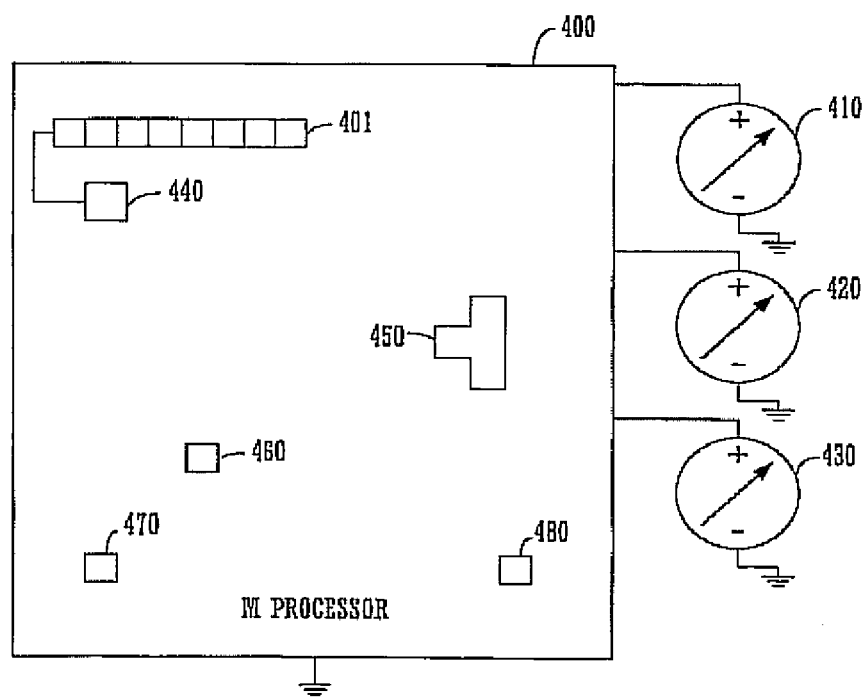
FIG. 4 illustrates a microprocessor, in accordance with embodiments of the present invention.

FIG. 4 illustrates a microprocessor 400, in accordance with embodiments of the present invention. Microprocessor 400 is configured to operate from a plurality of variable voltage supplies or controllable inputs, e.g., variable voltage supplies 410, 420 and 430. Variable voltage supply 410 provides a variable operating voltage to microprocessor 400. Variable voltage supply 420 provides a variable body biasing voltage to n type devices, e.g., NMOS devices, of microprocessor 400. Variable voltage supply 430 provides a variable body biasing voltage to p type devices, e.g., PMOS devices, of microprocessor 400.

Microprocessor 400 further comprises a plurality of dynamic operating indicators for indicating operating conditions of microprocessor 400, e.g., dynamic operating indicator circuits 440, 450, 460, 470, and 480. One or more of dynamic operating indicator circuits 440, 450, 460, 470, and 480 are well suited to the systems and methods taught in co-pending, commonly owned U.S. patent application Ser. No. 10/124,152, filed Apr. 16, 2002, entitled "System and Method for Measuring Transistor Leakage Current with a Ring Oscillator" and incorporated by reference herein.

Typically such dynamic operating indicator circuits will be situated in a variety of locations throughout a microprocessor integrated circuit. A wide variety of factors, including semiconductor process variation across an integrated circuit and other well known circuit layout influences, should be considered to determine where such dynamic operating indicator circuits are placed. Generally, each dynamic operating indicator circuit, e.g., dynamic operating indicator circuit 440, will have an associated dynamic operating indicator, e.g., register 401. The dynamic operating indicator 401 presents a measurement of a current integrated circuit operating characteristic, as measured by a dynamic operating indicator circuit, to microprocessor circuitry and/or software in a straightforward manner. It is to be appreciated that a direct correspondence between dynamic operating indicator circuits and dynamic operating indicators is exemplary, and that other structures to determine a current integrated circuit operating characteristic are well suited to embodiments in accordance with the present invention. For example, register 401 may represent a plurality of dynamic operating indicators. A selector mechanism can be provided to select which dynamic operating indicator is reported in register 401 at a particular time.

Embodiments in accordance with the present invention, systems and methods for closed loop feedback control of integrated circuits, are thus described. While the present invention has been described in particular embodiments, it should be appreciated that the present invention should not be construed as limited by such embodiments, but rather construed according to the below claims.

What is claimed is:

1. A method, comprising:
   measuring an operating indicator of an integrated circuit; and
   adjusting one or more controllable inputs to said integrated circuit to cause a measured value of said operating indicator to approach a desired value of said operating indicator.

2. The method of claim 1 wherein said one or more controllable inputs comprises an operating voltage of said integrated circuit.

3. The method of claim 1 wherein said one or more controllable inputs comprises a body bias voltage applied to a body well of said integrated circuit.

4. The method of claim 1 wherein said one or more controllable inputs comprises an operating frequency control input.

5. The method of claim 1 wherein said integrated circuit comprises a microprocessor.

6. The method of claim 5 wherein said operating indicator comprises a ring oscillator.

7. The method of claim 6 wherein said measuring comprises counting cycles of said ring oscillator.

8. An integrated circuit comprising:
   circuitry configured to measure an indicator of a behavior of said integrated circuit; and
   circuitry configured to adjust a controllable input to said integrated circuit to cause a measured value of said indicator to approach a desired value of said indicator.

9. The integrated circuit of claim 8 wherein said controllable input comprises an operating voltage of said integrated circuit.

10. The integrated circuit of claim 8 wherein said controllable input comprises a body bias voltage applied to a body well of said integrated circuit.

11. The integrated circuit of claim 8 wherein said controllable input comprises an operating frequency control input.

12. The integrated circuit of claim 8 wherein said indicator indicates a gate delay of said integrated circuit.

13. The integrated circuit of claim 12 wherein said indicator indicates a leakage current of said integrated circuit.

14. The integrated circuit of claim 6 wherein said indicator indicates a behavior of only one type of device from the set of P-FETs and N-FETs.

15. An article of manufacture including a computer readable medium having instructions stored thereon that, if executed by a computing device, cause the computing device to perform operations comprising:
   measuring an operating indicator of an integrated circuit; and
   adjusting one or more controllable inputs to said integrated circuit to cause a measured value of said operating indicator to approach a desired value of said operating indicator.

16. The article of manufacture of claim 15 wherein said integrated circuit comprises said computing device.

17. The article of manufacture of claim 15 wherein said one or more controllable inputs comprises an operating voltage of said integrated circuit.

18. The article of manufacture of claim 15 wherein said one or more controllable inputs comprises a body bias voltage applied to a body well of said integrated circuit.

19. The article of manufacture of claim 15 wherein said operating indicator comprises a ring oscillator.

20. The article of manufacture of claim 15 wherein said operating indicator indicates a behavior of only n-type MOSFETs.

* * * * *